(12) United States Patent
De Vries et al.

(10) Patent No.: US 9,832,562 B2
(45) Date of Patent: Nov. 28, 2017

(54) HEARING AID WITH PROBABILISTIC HEARING LOSS COMPENSATION

(71) Applicant: GN Hearing A/S, Ballerup (DK)

(72) Inventors: Aalbert De Vries, Eindhoven (NL); Mojtaba Farmani, Eindhoven (NL)

(73) Assignee: GN Hearing A/S, Ballerup (DK)

( * ) Notice: Subject to any disclaimer, the term of this patent is extended or adjusted under 35 U.S.C. 154(b) by 0 days.

(21) Appl. No.: 14/077,031

(22) Filed: Nov. 11, 2013

(65) Prior Publication Data
US 2015/0125016 A1 May 7, 2015

(30) Foreign Application Priority Data

Nov. 7, 2013 (DK) .................................. 2013 70656
Nov. 7, 2013 (EP) ..................................... 13191993

(51) Int. Cl.
  *H04R 25/00* (2006.01)
  *H04R 1/10* (2006.01)
  *H03G 9/02* (2006.01)
  *H03G 9/18* (2006.01)

(52) U.S. Cl.
  CPC ........... *H04R 1/1091* (2013.01); *H04R 25/00* (2013.01); *H04R 25/505* (2013.01); *H04R 25/70* (2013.01); *H03G 9/025* (2013.01); *H03G 9/18* (2013.01)

(58) Field of Classification Search
  CPC .................................................... H04R 25/70
  USPC .................................................. 381/314, 60
  See application file for complete search history.

(56) References Cited

U.S. PATENT DOCUMENTS

| 5,027,410 A | 6/1991 | Williamson et al. |
| 6,094,489 A | 7/2000 | Ishige et al. |
| 2008/0212810 A1 | 9/2008 | Pedersen |
| 2010/0008526 A1* | 1/2010 | De Vries ................ H04R 25/70 381/314 |

FOREIGN PATENT DOCUMENTS

| DK | 176190 B1 | 12/1994 |
| DK | 199701429 A | 7/1998 |
| DK | 1351550 T | 2/2011 |
| DK | 201270210 A | 10/2013 |
| EP | 1 104 222 A2 | 5/2001 |
| EP | 2658 120 A1 | 10/2013 |
| WO | 2004111994 A2 | 12/2004 |
| WO | 2013091703 A1 | 6/2013 |
| WO | 2013/139106 A1 | 9/2013 |

OTHER PUBLICATIONS

Examination Report and Search Report dated Feb. 28, 2014 in Application No. PA 2013 70656 (8 pages).
(Continued)

*Primary Examiner* — Amir Etesam
(74) *Attorney, Agent, or Firm* — Vista IP Law Group, LLP

(57) ABSTRACT

A hearing aid includes: an input transducer for provision of an audio signal in response to sound; a hearing loss model for calculation of a hearing loss as a function of a signal level of the audio signal; and a probabilistic hearing loss compensator that is configured to process the audio signal into a hearing loss compensated audio signal in such a way that the hearing loss is restored to normal hearing in accordance with the hearing loss model.

23 Claims, 9 Drawing Sheets

(56) References Cited

OTHER PUBLICATIONS

Extended European Search Report dated Apr. 16, 2014 in Application No. 13191993.8-1907 (12 pages).
Chalupper, "Simulation of hearing impairment based on the Fourier time transformation", Acoustics, Speech, and Signal Processing, ICASSP '00 Proceedings, 2000 (4 pages).
Bondy et al., "Modeling intelligibility of hearing-aid compression circuits", Conference record of the 37th asilomar conforence on signals, systems, & computers, vol. 1, pp. 720-724 dated Nov. 9, 2003 (6 pages).
Bondy et al., "A novel signal-processing strategy for hearing-aid design: neurocompensation", Elsevier Science Publishers, vol. 84, No. 7, pp. 1239-1253 dated Jul. 1, 2004 (16 pages).
Byrne et al., "NAL-NL1 Procedure for Fitting Nonlinear Hearing Aids: Characterisitics and Comparisons with Other Procedures", Journal of the American Academy of Audiology, vol. 12, No. 1, pp. 37-51 dated Jan. 1, 2001 (16 pages).
Chen et al., "Theory of Monte Carlo Sampling-Based Aloplex Algorithms for Neural Networks", Acoustics, Speech, and Signal Processing, 2004. Proceedings. IEE International Conference on Montreal, Quebec, Canada. vol. 5, pp. 501-504 dated May 17, 2004 (4 pages).
Chen et al., "A Novel Model-Based Hearing Compensation Design Using a Gradient-Free Optimization Method", Neural Computation, vol. 17, No. 12, pp. 1-24 dated Dec. 1, 2005 (24 pages).
Ho et al., "A Bayesian Approach to Problems in Stochastic Estimation and Control", IEEE Transaction on Automatic Control, vol. 9, No. 1, pp. 333-339 dated Oct. 1, 1964 (8 pages).
Moore, Simulation of the effects of loudness recruitment and threshold elevation of the intelligibility of speech in quiet and in background speech, J. Acoust. Soc. Am, 94(4), 2050-2062 dated Jun. 4, 1993 (13 pages).
Zureck, "Hearing loss and prosthesis simulation in audiology" The Hearing Journal, 60(7), 2007 (4 pages).
Second Technical Examination—Intention to Grant dated Aug. 27, 2014 for related DK Patent Application No. PA 2013 70656, 3 pages.
International Search Report and Written Opinion dated Feb. 17, 2015, for related PCT Patent Application No. PCT/EP2014/073788, 15 pages.
European Communication pursuant to Article 94(3) EPC dated Jun. 14, 2017 for corresponding EP Patent Application No. 13191993.8, 6 pages.

* cited by examiner

HEARING AID WITH PROBABILISTIC HEARING LOSS COMPENSATION

RELATED APPLICATION DATA

This application claims priority to and the benefit of Danish Patent Application No. PA 2013 70656, filed on Nov. 7, 2013, pending, and European Patent Application No. 13191993.8, filed on Nov. 7, 2013, pending. The entire disclosures of the above applications are expressly incorporated by reference herein.

FIELD

An embodiment described herein relates to a new hearing aid that is configured to perform probabilistic hearing loss compensation in accordance with a predetermined hearing loss model.

BACKGROUND

There are three main types of hearing loss:

Conductive hearing loss is present when the outer ear canal to the eardrum and the tiny bones (ossicles) of the middle ear cannot conduct sounds efficiently so that sound is not reaching the inner ear, the cochlea.

Sensorineural hearing loss is present when the inner ear (cochlea) or the nerve that transmits the impulses from the cochlea to the hearing centre in the brain or in the brain is damaged. The most common reason for sensorineural hearing loss is damage to the hair cells in the cochlea.

Mixed hearing loss is a combination of the two types of hearing loss discussed above.

Typically, a hearing impaired human suffering from sensorineural hearing loss experiences a loss of hearing sensitivity that is 1) frequency dependent and 2) dependent upon the loudness of sound at an ear.

Thus, a hearing impaired human may be able to hear certain frequencies, e.g., low frequencies, as well as a human with normal hearing, while other frequencies are not heard as well. Typically, hearing impaired humans experience loss of hearing sensitivity at high frequencies.

At frequencies with reduced sensitivity, the hearing impaired human is often able to hear loud sounds as well as the human with normal hearing, but unable to hear soft sounds with the same sensitivity as the human with normal hearing. Thus, the hearing impaired human suffers from a loss of dynamic range.

SUMMARY

A dynamic range compressor may be used in a hearing aid to compress the dynamic range of sound arriving at an ear of the hearing impaired human to match the residual dynamic range of the human in question. The degree of dynamic hearing loss of the hearing impaired human may be different in different frequency bands.

The slope of the input-output compressor transfer function is referred to as the compression ratio. The compression ratio required by a human may not be constant over the entire input power range, i.e. typically the compressor characteristic has one or more knee-points.

Thus, dynamic range compressors may be configured to perform differently in different frequency bands, thereby accounting for the frequency dependence of the hearing loss of the human in question. Such a multiband or multiband compressor divides an input signal into two or more frequency bands or frequency channels and then compresses each frequency band or channel separately. The parameters of the compressor, such as compression ratio, positions of knee-points, attack time constant, release time constant, etc. may be different for each frequency band.

Dynamic range compressors are fitted to the hearing loss of the human by adjustment of compressor parameters in accordance with accepted fitting rules and based on hearing thresholds determined for the human.

The fitting rules may not be motivated by a mathematical or algorithmic description of the hearing loss that the dynamic range compressor is intended to compensate for, so for example, time constants have to be set in accordance with empirical rules.

In absence of a proper description of the actual hearing loss, performance evaluation of the compressor's hearing loss compensation may be difficult. Indeed comparative evaluation of dynamic range compressor algorithms for hearing loss compensation is almost entirely based on subjective testing.

There is a need for a new method of hearing loss compensation that is based on proper mathematical descriptions of hearing loss. Such methods can be compared to each other and other methods of hearing loss compensation based on objective measures facilitating progress in hearing loss compensation methods.

It is an object of the new method of hearing loss compensation to perform probabilistic hearing loss compensation in accordance with a selected hearing loss model.

According to the new method, an acoustic signal arriving at an ear canal of a hearing impaired human is processed in such a way that the human's auditory system according to the hearing loss model obtains the same listening result as an auditory system of a human with normal hearing.

Thus, a new method of hearing loss compensation is provided, comprising the steps of
providing an audio signal in response to sound,
providing a hearing loss model for calculation of hearing loss as a function of a signal level of the audio signal,
probabilistically processing the audio signal into a hearing loss compensated audio signal in such a way that hearing loss is compensated to normal hearing in accordance with the hearing loss model.

Further, a new hearing aid is provided, comprising
an input transducer for provision of an audio signal in response to sound,
a hearing loss model for calculation of a hearing loss as a function of a signal level of the audio signal,
a probabilistic hearing loss compensator that is configured to process the audio signal into a hearing loss compensated audio signal in such a way that the hearing loss is restored to normal hearing in accordance with the hearing loss model, and preferably
an output transducer for conversion of the hearing loss compensated audio signal to an auditory output signal, such as an acoustic output signal, an implanted transducer signal, etc, that can be received by the human auditory system.

For example, the hearing aid may aim to restore loudness, such that the loudness of the received signal as it is perceived by a normal listener will match the perceived loudness of the processed signal for the hearing impaired listener.

Likewise, the hearing loss model may model spectral power patterns, speech intelligibility of the hearing impaired human, or quality of music of the hearing impaired human, or any combination of features of the hearing loss of the hearing impaired human in question.

The hearing loss model may be a Zurek Model as disclosed in: Patrick M. Zurek and Joseph G. Desloge: "Hearing loss and prosthesis simulation in audiology" The Hearing Journal, 60(7), 2007, Brian Moore and Brian Glasberg: "Simulation of the effects of loudness recruitment and threshold elevation of the intelligibility of speech in quiet and in background of speech", J. Acoust. Soc. Am, 94(4), 2050-2062, J. Chalupper and H. Fastl: "Simulation of hearing impairment based on the Fourier time transformation", Acoustics, Speech, and Signal Processing, ICASSP '00 Proceedings, 2000, etc.

The probabilistic compensator may include an algorithm based on Bayesian inference.

The probabilistic compensator may be a Kalman filter, an Extended Kalman filter, an online variational Bayesian Kalman filter, a particle filter or an Unscented Kalman filter, etc.

The signal level of the audio signal may be calculated as an average value of the audio signal, such as an rms-value, a mean amplitude value, a peak value, an envelope value, etc.

Often, the hearing loss of a human varies as a function of frequency. Thus, signal processing according to the new method, e.g. in the new hearing aid, may be performed differently for different frequencies, thereby accounting for the frequency dependence of the hearing loss of the human in question.

In the new hearing aid, the audio signal may be divided (e.g., using circuitry) into two or more frequency bands or frequency channels, and each frequency band or frequency channel may be processed individually.

The new hearing aid may form part of a new binaural hearing aid system comprising two hearing aids, one of which is intended for compensation of hearing loss of the left ear of the human and the other of which is intended for compensation of hearing loss of the right ear of the human. Both hearing aids may operate according to the new method.

The new probabilistic method of hearing loss compensation has the following advantages:

The predetermined hearing loss model forms part of the signal processing algorithm, Automatic inference of the hearing loss compensation gain for any given hearing loss model, Proper description of time constants, namely as inverse variances of probability distributions, Allows for probabilistic descriptions of the hearing loss model. In principle, hierarchical hearing loss models that relate individual models to 'average group' models are facilitated, Learning hearing loss compensation is facilitated, and A proper evaluation framework is provided for hearing loss compensation algorithms.

A transducer is a device that converts a signal in one form of energy to a corresponding signal in another form of energy.

The input transducer may comprise a microphone that converts an acoustic signal arriving at the microphone into a corresponding analogue audio signal in which the instantaneous voltage of the audio signal varies continuously with the sound pressure of the acoustic signal. Preferably, the input transducer comprises a microphone.

The input transducer may also comprise a telecoil that converts a magnetic field at the telecoil into a corresponding analogue audio signal in which the instantaneous voltage of the audio signal varies continuously with the magnetic field strength at the telecoil. Telecoils may be used to increase the signal to noise ratio of speech from a speaker addressing a number of people in a public place, e.g. in a church, an auditorium, a theatre, a cinema, etc., or through a public address systems, such as in a railway station, an airport, a shopping mall, etc. Speech from the speaker is converted to a magnetic field with an induction loop system (also called "hearing loop"), and the telecoil is used to magnetically pick up the magnetically transmitted speech signal.

The input transducer may further comprise at least two spaced apart microphones, and a beamformer configured for combining microphone output signals of the at least two spaced apart microphones into a directional microphone signal.

The input transducer may comprise one or more microphones and a telecoil and a switch, e.g. for selection of an omni-directional microphone signal, or a directional microphone signal, or a telecoil signal, either alone or in any combination, as the audio signal.

Typically, the analogue audio signal is made suitable for digital signal processing by conversion into a corresponding digital audio signal in an analogue-to-digital converter whereby the amplitude of the analogue audio signal is represented by a binary number. In this way, a discrete-time and discrete-amplitude digital audio signal in the form of a sequence of digital values represents the continuous-time and continuous-amplitude analogue audio signal.

Throughout the present disclosure, the "audio signal" may be used to identify any analogue or digital signal forming part of the signal path from the output of the input transducer to an input of the processor.

Throughout the present disclosure, the "hearing loss compensated audio signal" may be used to identify any analogue or digital signal forming part of the signal path from the output of the signal processor to an input of the output transducer.

Signal processing in the new hearing aid may be performed by dedicated hardware or may be performed in one or more signal processors, or performed in a combination of dedicated hardware and one or more signal processors.

As used herein, the terms "processor", "signal processor", "controller", "system", etc., are intended to refer to CPU-related entities, either hardware, a combination of hardware and software, software, or software in execution.

For example, a "processor", "signal processor", "controller", "system", etc., may be, but is not limited to being, a process running on a processor, a processor, an object, an executable file, a thread of execution, and/or a program.

By way of illustration, the terms "processor", "signal processor", "controller", "system", etc., designate both an application running on a processor and a hardware processor. One or more "processors", "signal processors", "controllers", "systems" and the like, or any combination hereof, may reside within a process and/or thread of execution, and one or more "processors", "signal processors", "controllers", "systems", etc., or any combination hereof, may be localized on one hardware processor, possibly in combination with other hardware circuitry, and/or distributed between two or more hardware processors, possibly in combination with other hardware circuitry.

Also, a processor (or similar terms) may be any component or any combination of components that is capable of performing signal processing. For examples, the signal processor may be an ASIC processor, a FPGA processor, a general purpose processor, a microprocessor, a circuit component, or an integrated circuit.

A hearing aid includes: an input transducer for provision of an audio signal in response to sound; a hearing loss model for calculation of a hearing loss as a function of a signal level of the audio signal; and a probabilistic hearing loss compensator that is configured to process the audio signal into a hearing loss compensated audio signal in such a way that the hearing loss is restored to normal hearing in accordance with the hearing loss model.

Optionally, the hearing loss relates to at least one of spectral power, loudness, speech reception threshold, and quality of music.

Optionally, the probabilistic hearing loss compensator is configured to operate based on Bayesian inference.

Optionally, the probabilistic hearing loss compensator comprises a Kalman filter, an Extended Kalman filter, an online variational Bayesian Kalman filter, an Unscented Kalman filter, or a particle filter.

Optionally, the hearing loss model is based on a Zurek model.

Optionally, the signal level of the audio signal comprises an average value of the audio signal, a rms-value of the audio signal, a mean amplitude value of the audio signal, a peak value of the audio signal, or an envelope value of the audio signal.

Optionally, the probabilistic hearing loss compensator is configured to determine a gain using a recursive technique.

Optionally, the probabilistic hearing loss compensator is configured to determine the gain based on the hearing loss model.

Optionally, the probabilistic hearing loss compensator is configured to determine the gain using Kalman filtering principle that comprises the recursive technique.

A method of hearing loss compensation includes: providing an audio signal in response to sound; providing a hearing loss model for calculation of hearing loss as a function of a signal level of the audio signal; and probabilistically processing the audio signal into a hearing loss compensated audio signal in such a way that the hearing loss is restored to normal hearing in accordance with the hearing loss model.

Optionally, the hearing loss relates to at least one of spectral power, loudness, speech reception threshold, and quality of music.

Optionally, the probabilistically processing is performed based on Bayesian inference.

Optionally, the probabilistically processing is performed using a probabilistic compensator, the probabilistic compensator being a Kalman filter, an Extended Kalman filter, an online variational Bayesian Kalman filter, an Unscented Kalman filter, or a particle filter.

Optionally, the probabilistically processing comprises determining a gain using a recursive technique.

Optionally, the probabilistically processing comprises determining the gain using Kalman filtering principle that comprises the recursive technique.

Other and further aspects and features will be evident from reading the following detailed description.

BRIEF DESCRIPTION OF THE FIGURES

The drawings illustrate the design and utility of embodiments, in which similar elements are referred to by common reference numerals. These drawings may or may not be drawn to scale. In order to better appreciate how the above-recited and other advantages and objects are obtained, a more particular description of the embodiments will be rendered, which are illustrated in the accompanying drawings. These drawings depict only exemplary embodiments and are not therefore to be considered limiting in the scope of the claims.

In the following, the new method and hearing aid is explained in more detail with reference to the drawings, wherein.

DETAILED DESCRIPTION

Various embodiments are described hereinafter with reference to the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated.

In the following, various examples of the new method and hearing aid are illustrated. The new method and hearing aid according to the appended claims may, however, be embodied in different forms and should not be construed as limited to the examples set forth herein.

The Hearing Loss Model

Figure 1:
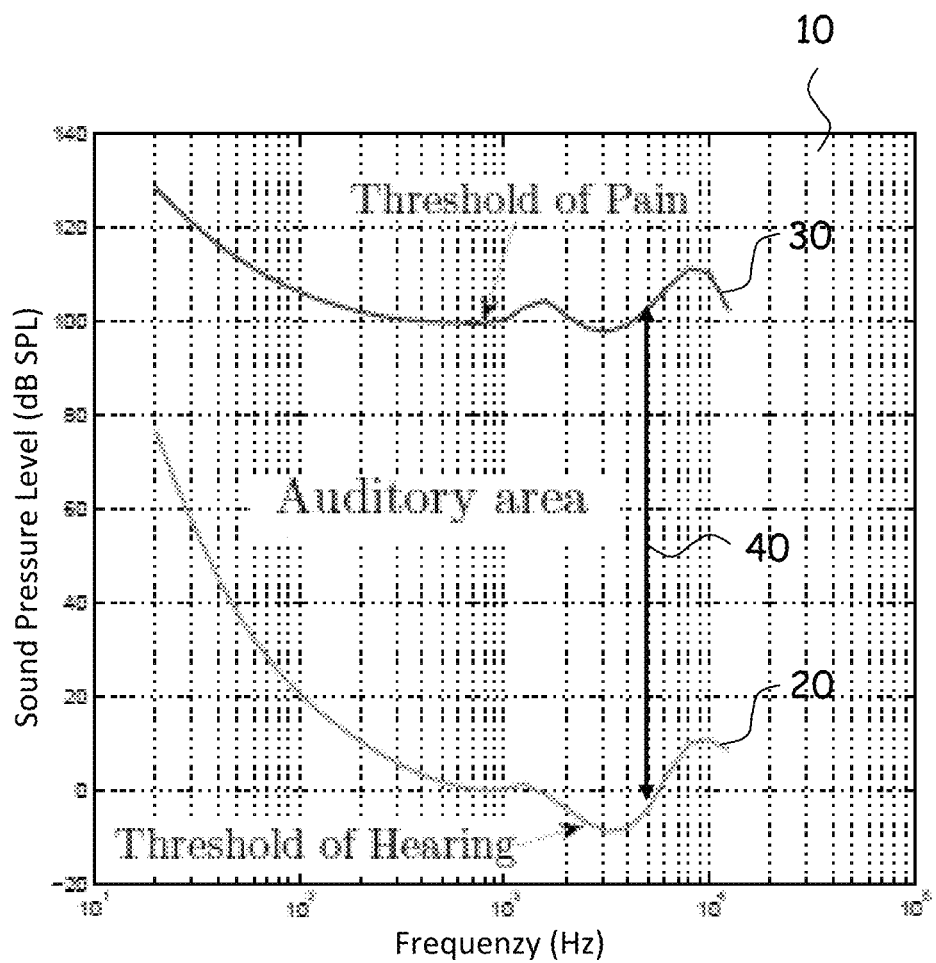
FIG. 1 shows a plot of human normal hearing auditory threshold levels as a function of frequency.

FIG. 1 shows a plot 10 of human normal hearing auditory threshold levels as a function of frequency. Humans are able to hear sounds in the frequency range from about 20 Hz to about 20 kHz.

The lower curve 20 shows the hearing threshold, i.e. the lowest sound pressure levels the human auditory system can detect. Sound pressure levels below the lower curve cannot be heard by a human with normal hearing.

The upper curve 30 shows the upper comfort level or pain threshold, i.e. the highest sound pressure levels the human can listen to without feeling pain or discomfort.

The range between the hearing threshold 20 and the pain threshold 30 is the dynamic range of normal hearing 40 that varies as a function of frequency.

Different hearing loss models may be provided for the respective types of hearing loss.

For ease of understanding, in the following, the new method of hearing loss compensation is disclosed with relation to a particular hearing loss model, namely the hearing loss model proposed by Patrick M Zurek and Joseph G Desloge: "Hearing loss and prosthesis simulation in audiology", The Hearing Journal, 60(7), 2007, in the following denoted the Zurek model. However, obviously other models of hearing loss may substitute the Zurek model in the new method.

Figure 2:
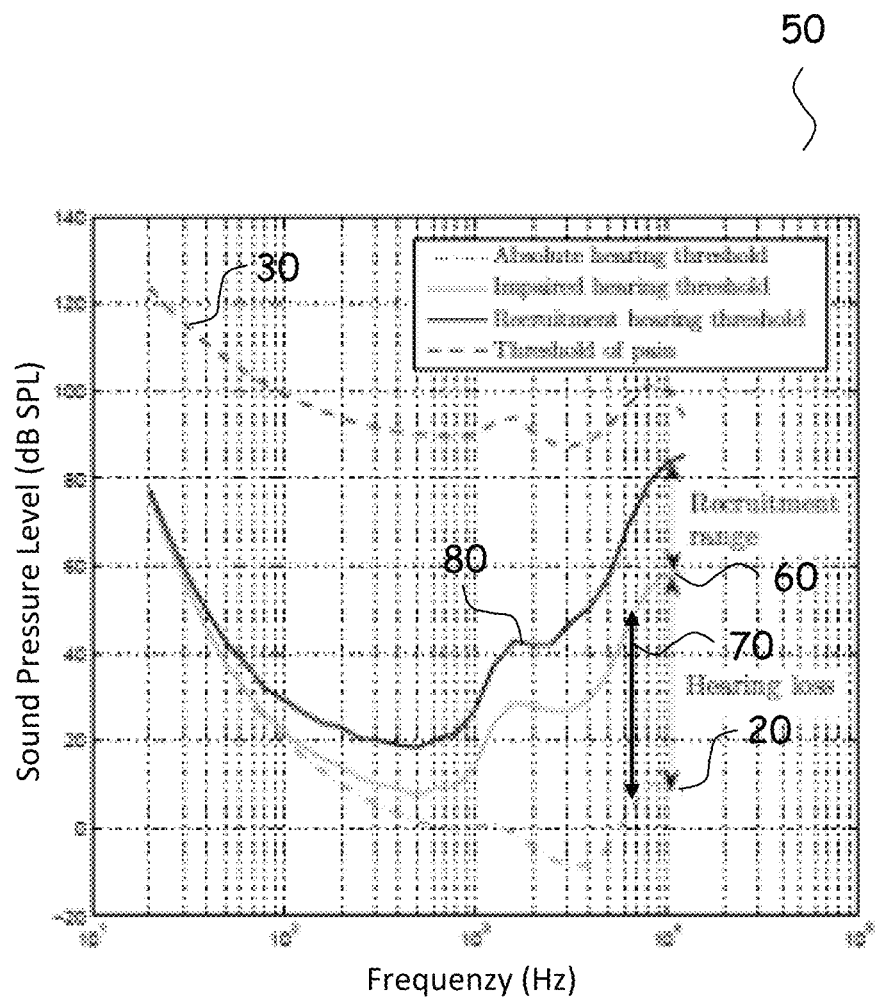
FIG. 2 shows an exemplary plot of human hearing loss thresholds and recruitment threshold as a function of frequency.

FIG. 2 illustrates a hearing loss modelled by the Zurek model. FIG. 2 shows a plot 50 of four hearing auditory threshold levels as a function of frequency. The thresholds of normal hearing shown in FIG. 1 are plotted as dashed curves 20, 30 in FIG. 2. The second lower most curve 60 is the hearing threshold of a hearing impaired human. The hearing impaired human cannot hear sounds below the second lower most curve 60. The range between the lower most and the second lower most curves 20, 60 represents the lost dynamic range 70 of the hearing impaired human.

The second upper most curve 80 is the recruitment threshold. The hearing impaired human hears sounds above the recruitment threshold 80 as with normal hearing.

Figure 3:
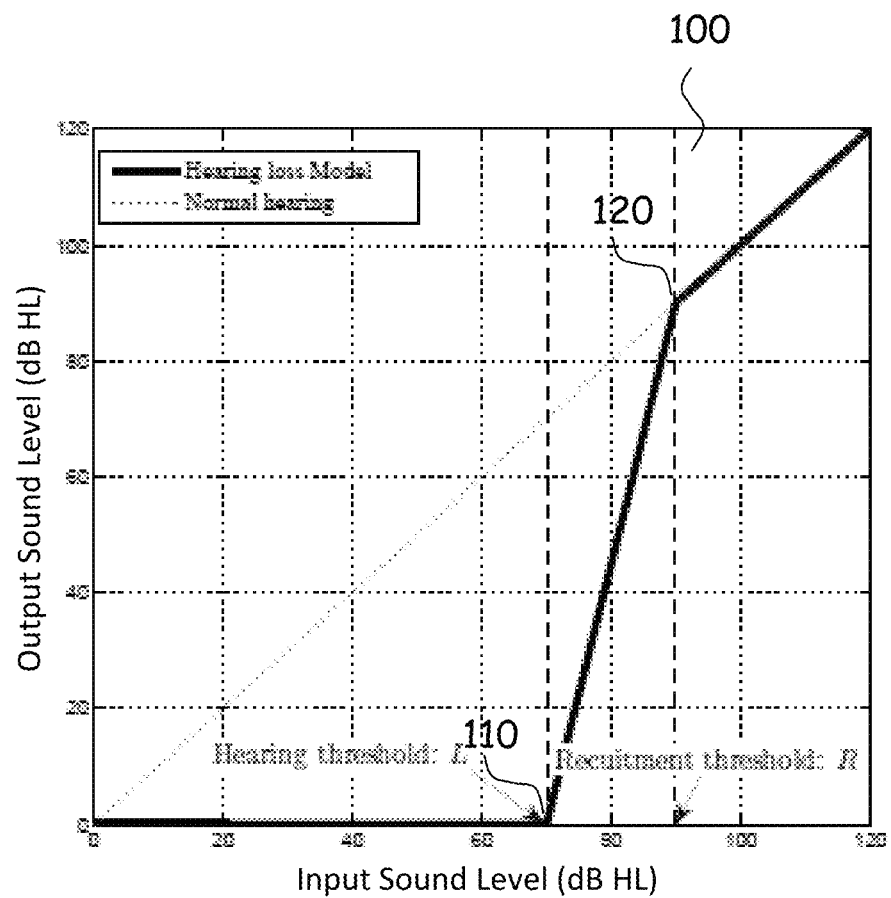
FIG. 3 shows a plot of input-output transfer function of a Zurek hearing loss model.

FIG. 3 shows a plot 100 of input-output transfer function of a corresponding Zurek hearing loss model in a specific frequency band with a hearing threshold 110 of L=70 dB HL and a recruitment threshold 120 of R=90 dB HL.

According to this hearing loss model, the hearing sensation level f, i.e. the sound level in dB relative to the hearing threshold, is given by:

$$f_{Zurek}(x) = \begin{cases} 0 & x < L \\ \frac{R}{R-L}(x-L) & L \leq x \leq R \\ x & x > R \end{cases} \quad (1)$$

wherein x is the input sound level in dB HL.

Probabilistic Hearing Loss Compensator

In the following, the new method of hearing loss compensation is disclosed with relation to loudness restoration; however, obviously hearing loss may be characterized otherwise, e.g. by speech reception threshold, combinations of loudness and speech reception threshold, etc, to be restored to normal hearing, whereby the human's auditory system according to the selected hearing loss model obtains the same listening result as an auditory system of a human with normal hearing.

For loudness restoration with any model of hearing loss, in a frequency band $\omega$, it is desired to apply a gain $g_\omega$ to the input signal so that loudness as perceived by the hearing impaired human is restored to the loudness as perceived by a normal hearing human:

$$f_{HL}(y_\omega + g_\omega) \sim y_\omega \quad (2)$$

where $y_\omega$ is the audio signal level in dB in the frequency band $\omega$,
$g_\omega$ is the estimated gain in dB in the frequency band $\omega$, and
$f_{HL}(.)$ is the hearing loss model.

For simplicity, the frequency band suffix $\omega$ is omitted in the equations below.

Figure 4:
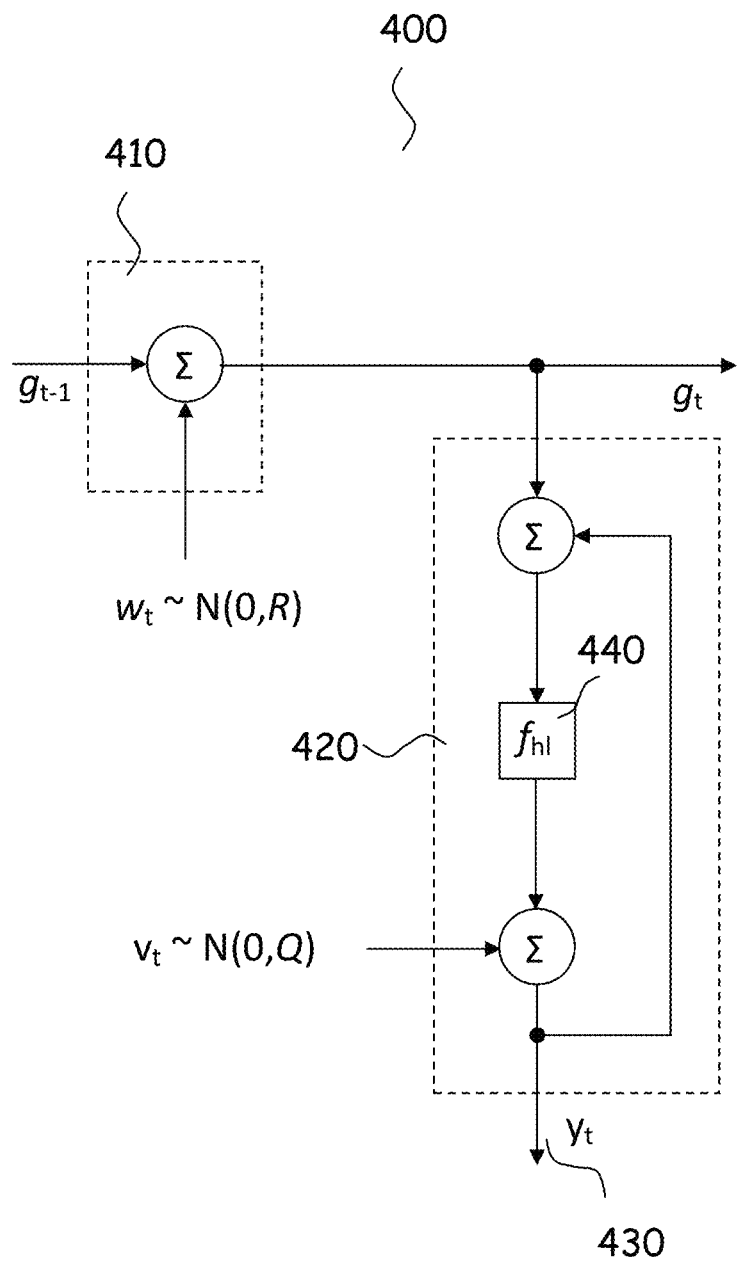
FIG. 4 shows a block diagram of a probabilistic prediction model.

FIG. 4 illustrates a block diagram of a prediction model 400 formed in accordance with the new method. The illustrated prediction model 400 has a state transition part 410 and an observation part 420, and it calculates the gain based on the audio signal level $y_t$ 430 and a human's hearing model $f_{HL}$ 440.

FIG. 4 illustrates processing in a single frequency band or channel. The illustrated single frequency band may constitute the entire frequency band of a single band probabilistic hearing loss compensator; or, the illustrated single frequency band may constitute one individual frequency band of a plurality of frequency bands of a multiband probabilistic hearing loss compensator.

Rapidly changing gain has unfavourable effects on the sound quality and is therefore not desired.

The prediction model is defined accordingly:

$$g_t = g_{t-1} + w_t \quad (3)$$

where t is the discrete time index, g is the provided gain in dB, and $w_t$ is the process noise which is modelled by a white Gaussian noise—$w_t \sim N(0, St)$, where St is the (possibly time-varying) variance of the process noise.

The estimated gain $g_t$ is updated based on an observation model. As mentioned above with relation to equation (1), the hearing-impaired human is desired to perceive loudness similar to a normal-hearing human.

Therefore, the difference between $f_{HL}(y_t + g_t)$ and $y_t$ is observed as a zero-mean noise process:

$$y_t = f_{HL}(y_t + g_t) + v_t \quad (4)$$

where $v_t$ is the observation noise which is modelled by a white Gaussian noise—$v_t \sim N(0, Qt)$, where Qt is the (possibly time-varying) variance of the observation noise modelling uncertainties relating to the hearing loss model.

As an example, we compute the steady state gain as a function of the input power for Zurek's hearing loss model. Equation (2) is applied to the Zurek hearing loss model:

$$f_{zurek}(y+g) = y \rightarrow \quad (5)$$

$$g = f_{zurek}^{-1}(y) - y \quad (6)$$

In the Zurek model, see FIG. 3, in order to restore loudness to that of normal hearing, sounds with sound levels between the normal hearing threshold and the recruitment threshold have to be compressed into sound levels between the impaired hearing threshold and the recruitment threshold.

When $x \geq L$, the Zurek's model $f_{Zurek}(x)$ is a one-to-one function, and $f_{zurek}(x) \geq 0$.

Thus, for $x \geq L$:

$$f_{Zurek}^{-1}(x) = \begin{cases} \frac{R-L}{R}x + L & 0 \leq x \leq R \\ x & x > R \end{cases} \quad (7)$$

And $$g_{steady\_state} = \begin{cases} \frac{R-L}{R}x + L - x & 0 \leq x \leq R \\ 0 & x > R \end{cases} \quad (8)$$

where x is the sound level in dB HL; L is the human's hearing threshold, and R is the human's recruitment threshold in dB HL.

Figure 5:
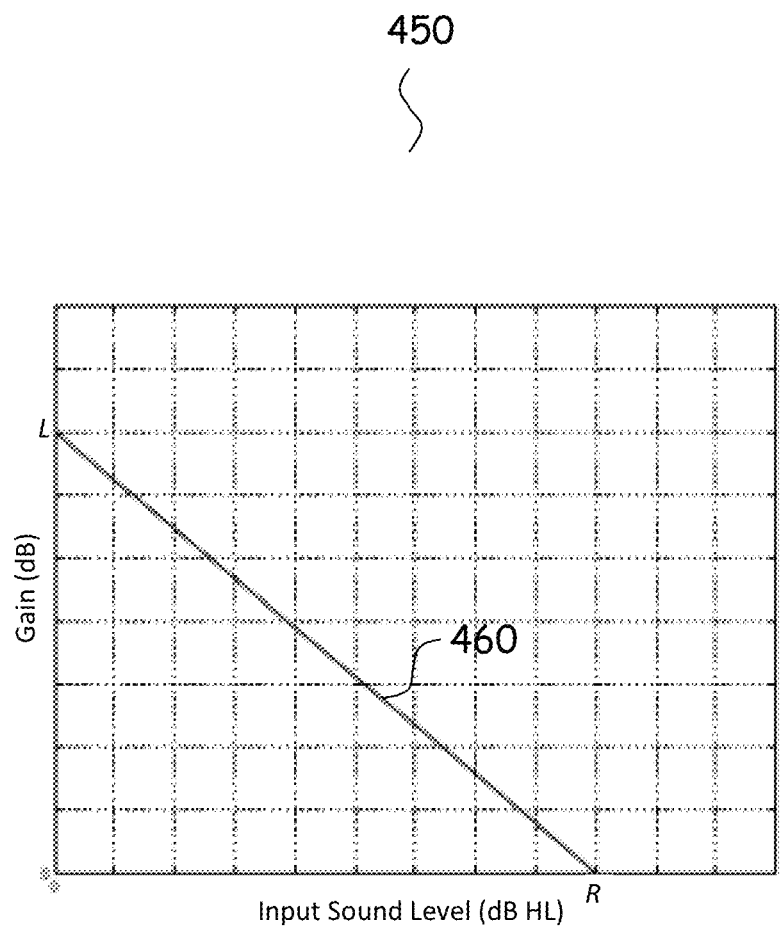
FIG. 5 shows a plot of gain calculations based on the Zurek hearing loss model.

FIG. 5 is a plot 450 of the gain vs. input curve of the steady-state gain based on the Zurek's hearing loss model. It is shown that the gain 460 required for restoring normal loudness perception, decreases linearly as a function of the hearing level (dB HL) from L dB at 0 dB hearing level to 0 dB at recruitment threshold R. The compression threshold is 0 dB HL and the compression ratio is R/(R−L).

According to Zurek's hearing loss model, the human can hear almost like a normal-hearing human when the input sound hearing level is larger than the recruitment threshold R and thus, the provided gain above the recruitment threshold should be 0 dB.

The gain-input curve 460 shown in FIG. 5 restores loudness to normal in accordance with Zurek's hearing loss model, but in practise, the large gain at low signals is likely to cause feedback and also amplifies noise that the human does not want to hear. Also large gain variations are likely to be experienced at low signal levels that undesirably distort the signal waveform.

Therefore, it is preferred to modify the gain-input curve 460 of FIG. 5 into the gain-input curve 200 shown in FIG. 6 wherein the gain is kept constant at αL dB below a selected compression threshold C.

The compression threshold C may be determined during fitting of the hearing aid to the human.

Figure 6:
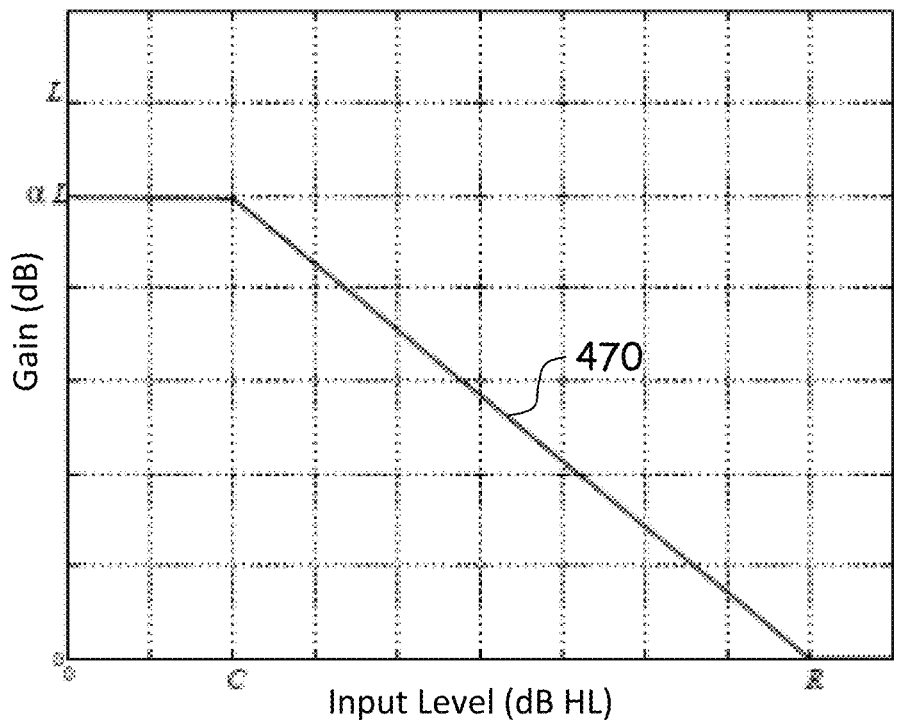
FIG. 6 shows a plot of gain calculations based on a modified Zurek hearing loss model.

The gain-input curve 470 shown in FIG. 6 is given by:

$$g = \begin{cases} \alpha L & x < C \\ \frac{-\alpha L}{R - C}(x - R) & C \leq x \leq R \\ 0 & x > R \end{cases} \quad (9)$$

wherein x is the input signal level in dB HL.

Equation (9) is inserted into equation (2), whereby $$f_L(x) = \begin{cases} x - \alpha L & x < C + \alpha L \\ \frac{R - C}{R - (C + \alpha L)}(x - R) + R & C + \alpha L \leq x \leq R \\ x & x > R \end{cases} \quad (10)$$

where x is the input sound level in dB HL. L and R represent the hearing threshold and the recruitment threshold of the human in dB HL, respectively. α∈[0, 1], and C is the compression threshold in dB HL, and $$\frac{R - C}{R - (C + \alpha L)}$$

is the compression ratio of the model.

Probabilistic Hearing Loss Compensator

Figure 7:
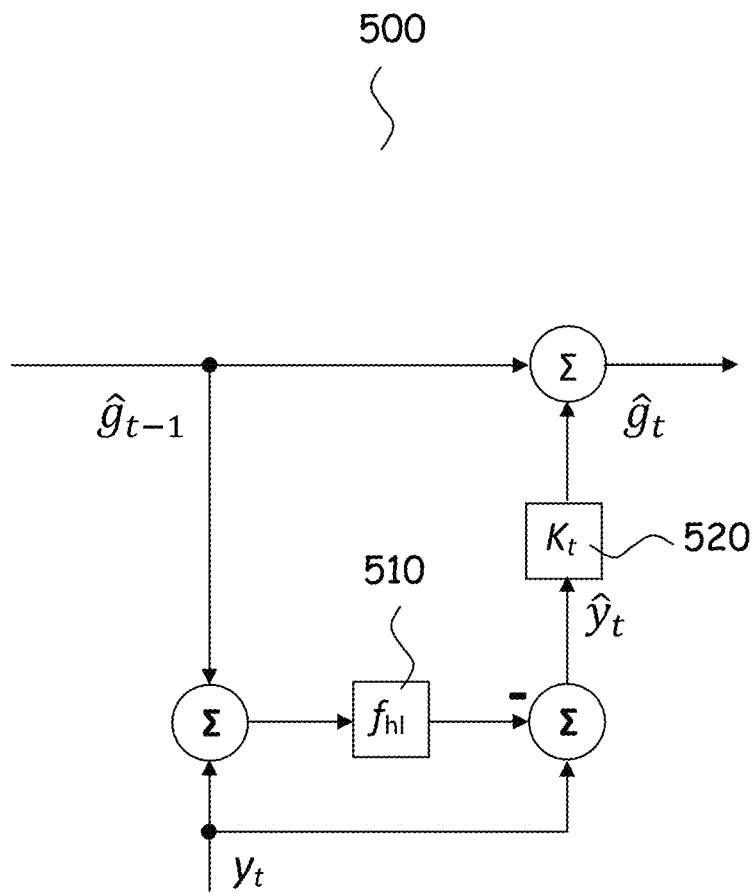
FIG. 7 shows a block diagram of a probabilistic hearing loss compensator.

FIG. 7 shows a block diagram of a probabilistic hearing loss compensator 500 that operates in accordance with the new method.

FIG. 7 illustrates processing in a single frequency band or channel ω. The illustrated single frequency band ω may constitute the entire frequency band of a single band probabilistic hearing loss compensator; or, the illustrated single frequency band ω may constitute one individual frequency band of a plurality of frequency bands of a multiband probabilistic hearing loss compensator.

In a multiband probabilistic hearing loss compensator, the frequency bands ω may have the same bandwidth, or, some or all of the frequency bands may have different bandwidths. Varying bandwidths may for example result from frequency warping.

The illustrated probabilistic hearing loss compensator has a hearing loss model $f_{hl}$ 510 and an Extended Kalman filter $K_t$ 520 for determination of the gain applied in the respective frequency band ω.

In the following, the system is assumed to constitute a dynamic system perturbed by Gaussian noise; however it should be noted that any type of Kalman filter may be used as $K_t$ 520 in FIG. 7, such as a Kalman filter, an Extended Kalman filter, an online variational Bayesian Kalman filter, an Unscented Kalman filter or a particle filter, etc, reference is made to the extensive literature on Kalman filters.

Likewise, the Zurek model is used in the illustrated example; however it should be noted that any hearing loss model may be used as the hearing loss model $f_{hl}$ 510 in FIG. 7.

In order to infer the time-varying gain $g_t$ in the selected frequency band, we first describe the problem by a generative probabilistic model:

$$g_t = g_{t-1} + w_t,$$

$$y_t = f_{hl}(y_t + g_t) + v_t,$$

$$w_t \sim N(0, S_t),$$

$$v_t \sim N(0, Q_t)$$

Wherein $g_t$ is the gain compensating the hearing loss in accordance with the hearing loss model $f_{hl}$ 510, $y_t$ is the input signal level in dB SPL, $w_t$ is the system noise, and $v_t$ is the observation noise.

The generative model can be inverted through Bayesian reasoning. In the case that model $f_{hl}$ is a nonlinear model, Bayesian inference by an Extended Kalman filter leads to the following equations:

$$F_t = \frac{\partial f_{hl}}{\partial g}\bigg|_{\hat{g}_t^-, y_t}$$

$$\hat{g}_t^- = \hat{g}_{t-1}$$

$$P_t^- = P_{t-1} + Q_t$$

$$\hat{y}_t = y_t - f_{hl}(\hat{g}_t^- + y_t)$$

$$K_t = P_t^- F_t^T (F_t P_t^- F_t^T + S_t)^{-1}$$

$$\hat{g}_t = \hat{g}_t^- + K_t \hat{y}_t$$

$$P_t = (I - K_t F_t) P_t^-.$$

In another example and under the assumption that the system is a linear dynamic system perturbed with Gaussian noise, a regular Kalman filter may update the gain. In that case, $F_t$ would refer to the linear transfer function of the hearing loss model.

Figure 8:
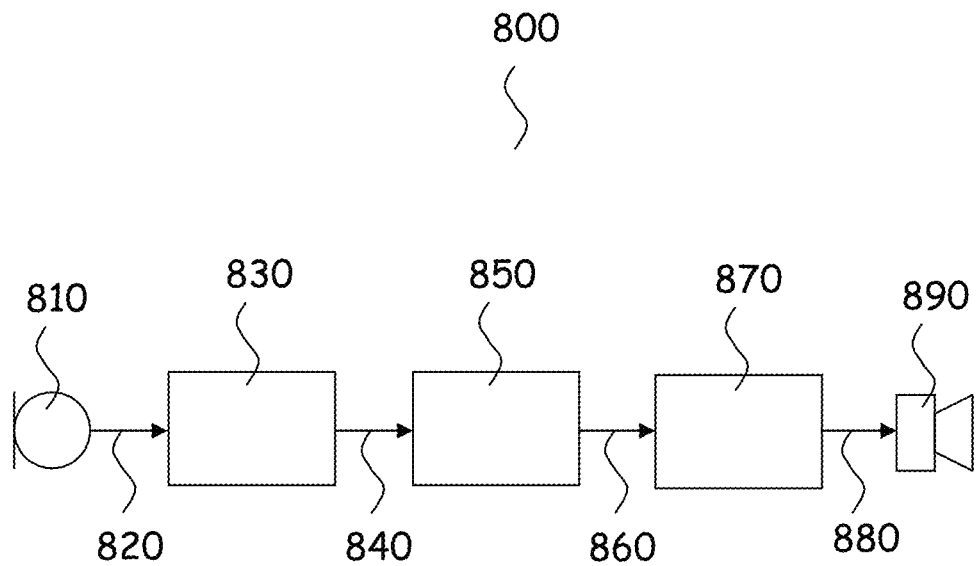
FIG. 8 shows a block diagram of a hearing aid operating according to the new method.

FIG. 8 is a simplified block diagram of a new digital hearing aid 800 operating according to the new method of hearing loss compensation. The hearing aid 800 comprises an input transducer 810, preferably a microphone, for provision of an audio signal 820 input to an analogue-to-digital (A/D) converter 830 for provision of a digital audio signal 840 in response to sound signals received at the input transducer 810, a signal processor 850, e.g. a digital signal processor or DSP, that is configured to process the digital audio signal 840 in accordance with the new method of hearing loss compensation into a hearing loss compensated output signal 860, a digital-to-analogue (D/A) converter 870 for conversion of the digital signal 860 into a corresponding analogue output signal 880, and an output transducer 890, preferably a receiver 890, for conversion of the analogue output signal 880 into an acoustic output signal for transmission towards an eardrum of the human.

Figure 9:
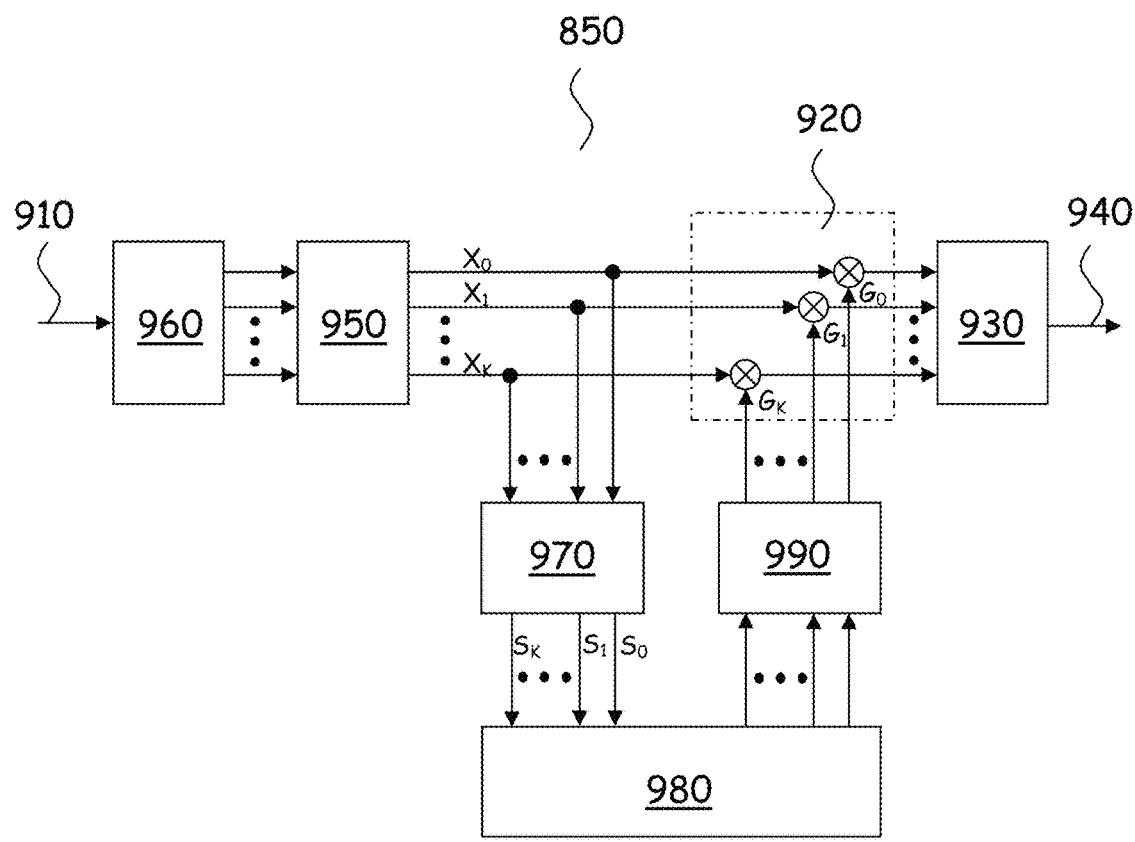
FIG. 9 shows a block diagram of a hearing aid with a probabilistic hearing loss compensator.

FIG. 9 shows parts of the signal processor 850 in more detail, namely an exemplary multiband probabilistic hearing loss compensator 850. In the illustrated example, the multiband probabilistic hearing loss compensator 850 has K+1 frequency bands, and K may be any integer larger than or equal to 1.

The illustrated multiband probabilistic hearing loss compensator 850 has a digital input for receiving a digital input signal 910 from the A/D converter 830, and a multiband amplifier 920 that performs compensation for frequency dependent hearing loss. The multiband amplifier 920 applies appropriate gains $G_0, G_1, \ldots, G_K$ to the respective signals $X_0, X_1, \ldots, X_K$ in each of its frequency bands $0, 1, \ldots, K$ for compensation of frequency dependent hearing loss. The amplified signals $G_0X_0, G_1X_1, \ldots, G_KX_K$ of each frequency band are added together in adder 930 to form the output signal 940.

In general, the probabilistic hearing loss compensation may take place individually in different frequency bands. Various probabilistic hearing loss compensators may have different number of frequency bands and/or frequency bands with different bandwidths and/or crossover frequencies.

The multiband probabilistic hearing loss compensator 850 illustrated in FIG. 9 is a warped multiband probabilistic hearing loss compensator 850 that divides the digital input signal into warped frequency bands $0, 1, 2, \ldots, K$.

A non-warped FFT 950 operates on a tapped delay line 960 with first order all-pass filters providing frequency warping enabling adjustment of crossover frequencies, which are adjusted to provide the desired response in accordance with the humans hearing impairment.

The multiband probabilistic hearing loss compensator 850 further comprises a multiband signal level detector 970 for individual determination of the signal level $S_0, S_1, \ldots, S_K$ of each respective frequency band signal $X_0, X_1, \ldots, X_K$. The outputs $S_0, S_1, \ldots, S_K$ of the signal level detectors 970 are provided to the respective Kalman filters 580 of the probabilistic hearing loss compensator 850 as shown in more detail in FIGS. 6 and 8 for determination of probabilistic hearing loss compensating band gains $G_0, G_1, \ldots, G_K$ to be applied by the multiband amplifier 920 to the signals $X_0, X_1, \ldots, X_K$ of the respective frequency bands.

The multiband signal level detector 970 calculates an average value of the audio signal in each warped frequency band, such as an rms-value, a mean amplitude value, a peak value, an envelope value, e.g. as determined by a peak detector, etc.

The multiband signal level detector 970 may calculate running average values of the audio signal; or operate on block of samples. Preferably, the multiband signal level detector operates on blocks of samples whereby required processor power is lowered.

The probabilistic hearing loss compensator gain outputs $G_0, G_1, \ldots, G_K$ are calculated and applied batch-wise for a block of samples whereby required processor power is diminished. When the probabilistic hearing loss compensator operates on blocks of signal samples, the probabilistic hearing loss compensator gain control unit 980 operates at a lower sample frequency than other parts of the system. This means that the probabilistic hearing loss compensator gains only change every N'th sample where N is the number of samples in the block. Probable artefacts caused by fast changing gain values are suppressed by low-pass filters 990 at the gain outputs of the probabilistic hearing loss compensator gain control unit 980 for smoothing gain changes at block boundaries.

Although particular embodiments have been shown and described, it will be understood that they are not intended to limit the claimed inventions, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

The invention claimed is:

1. A hearing aid comprising:
    an input transducer for provision of an audio signal in response to sound;
    a hearing loss model for calculation of a hearing loss as a function of a signal level of the audio signal; and
    a probabilistic hearing loss compensator that is configured to probabilistically process the audio signal into a hearing loss compensated audio signal in such a way that the hearing loss is restored to normal hearing in accordance with the hearing loss model, wherein the probabilistic hearing loss compensator is configured to probabilistically process the audio signal during normal use of the hearing aid by a user;
    wherein the probabilistic hearing loss compensator comprises a filter configured to provide an input for a combiner.

2. The hearing aid according to claim 1, wherein the hearing loss relates to at least one of spectral power, loudness, speech reception threshold, and quality of music.

3. The hearing aid according to claim 1, wherein the probabilistic hearing loss compensator is configured to operate based on Bayesian inference.

4. The hearing aid according to claim 1, wherein the probabilistic hearing loss compensator comprises a Kalman filter, an Extended Kalman filter, an online variational Bayesian Kalman filter, an Unscented Kalman filter, or a particle filter.

5. The hearing aid according to claim 1, wherein the hearing loss model is based on a Zurek model.

6. The hearing aid according to claim 1, wherein the signal level of the audio signal comprises an average value of the audio signal, a rms-value of the audio signal, a mean amplitude value of the audio signal, a peak value of the audio signal, or an envelope value of the audio signal.

7. The hearing aid according to claim 1, wherein the probabilistic hearing loss compensator is configured to determine a gain using a recursive technique.

8. The hearing aid according to claim 7, wherein the probabilistic hearing loss compensator is configured to determine the gain based on the hearing loss model.

9. The hearing aid according to claim 7, wherein the probabilistic hearing loss compensator is configured to determine the gain using Kalman filtering principle that comprises the recursive technique.

10. A method of hearing loss compensation performed by a hearing aid, the method comprising:
    providing an audio signal in response to sound;
    providing a hearing loss model for calculation of hearing loss as a function of a signal level of the audio signal; and
    probabilistically processing the audio signal into a hearing loss compensated audio signal in such a way that the hearing loss is restored to normal hearing in accordance with the hearing loss model, wherein the act of probability processing the audio signal is performed during a normal use of the hearing aid by a user;
    wherein the act of probability processing the audio signal comprises using a filter configured to provide an input for a combiner.

11. The method according to claim 10, wherein the hearing loss relates to at least one of spectral power, loudness, speech reception threshold, and quality of music.

12. The method according to claim 10, wherein the probabilistically processing is performed based on Bayesian inference.

13. The method according to claim 10, wherein the probabilistically processing is performed using a probabilistic compensator, the probabilistic compensator being a Kalman filter, an Extended Kalman filter, an online variational Bayesian Kalman filter, an Unscented Kalman filter, or a particle filter.

14. The method according to claim 10, wherein the probabilistically processing comprises determining a gain using a recursive technique.

15. The method according to claim 14, wherein the probabilistically processing comprises determining the gain using Kalman filtering principle that comprises the recursive technique.

16. The hearing aid according to claim 1, wherein the probabilistic hearing loss compensator is configured to probabilistically process the audio signal into the hearing loss compensated audio signal after a fitting procedure.

17. The hearing aid according to claim 1, wherein the probabilistic hearing loss compensator is configured to probabilistically process the audio signal into the hearing loss compensated audio signal after the hearing aid has been configured.

18. The method according to claim 10, wherein the probabilistically processing of the audio signal is performed after a fitting procedure.

19. The method according to claim 10, wherein the probabilistically processing of the audio signal is performed after a hearing aid receiving the audio signal has been configured.

20. The hearing aid according to claim 1, wherein the hearing loss model is a probabilistic hearing loss model.

21. The hearing aid according to claim 1, wherein an operation of the hearing aid involves a time constant that is based on an inverse variance of a probability distribution.

22. The method according to claim 10, wherein the hearing loss model is a probabilistic hearing loss model.

23. The method according to claim 10, wherein the hearing loss is restored to normal hearing based on a time constant, the time constant being based on an inverse variance of a probability distribution.

* * * * *